(12) United States Patent
Fowler

(10) Patent No.: US 6,437,647 B1
(45) Date of Patent: Aug. 20, 2002

(54) CURRENT MIRROR COMPENSATION SYSTEM FOR POWER AMPLIFIERS

(75) Inventor: Thomas Fowler, Moorpark, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/772,717

(22) Filed: Jan. 30, 2001

(51) Int. Cl.$^7$ ................................................ H03F 3/04
(52) U.S. Cl. ........................ 330/288; 330/289; 330/296
(58) Field of Search ................................. 330/288, 296, 330/289

(56) References Cited

U.S. PATENT DOCUMENTS

| | | | | |
|---|---|---|---|---|
| 4,311,967 A | * | 1/1982 | Schade, Jr. | 330/288 |
| 4,409,558 A | * | 10/1983 | Knijnenburg et al. | 330/288 |
| 5,416,365 A | * | 5/1995 | Maida | 327/111 |
| 6,172,549 B1 | * | 1/2001 | Gilbert | 327/349 |
| 6,313,705 B1 | * | 11/2001 | Dening et al. | 330/276 |

* cited by examiner

Primary Examiner—Robert Pascal
Assistant Examiner—Patricia T. Nguyen
(74) Attorney, Agent, or Firm—Thomas, Kayden, Horstemeyer & Risley, LLP (57) ABSTRACT

Two compensating resistors in a mirror bias circuit coupled to a radio frequency (RF) amplifier are configured such that transistor base-emitter voltages are adjusted to stabilize RF transistor quiescent current for variations in collector voltage, Vcc. For example, when battery power is drained during device use, Vcc decreases. As Vcc decreases, less current is drawn through the compensating resistors, thereby decreasing the voltage drop across the compensating resistors and increasing the transistor base-emitter voltages in the mirror bias circuit and the radio frequency (RF) amplifier. Thus, the tendency of the RF transistor quiescent current to decrease as Vcc decreases is off-set because the compensating resistors cause an increase in the RF transistor base-emitter voltage, thereby increasing quiescent current. In one embodiment, the first compensating resistor size is equal to the second compensating resistor size multiplied by the ratio of the buffer transistor current rating to the mirror transistor current rating.

25 Claims, 7 Drawing Sheets

CURRENT MIRROR COMPENSATION SYSTEM FOR POWER AMPLIFIERS

BACKGROUND OF THE INVENTION

1. Field of the Invention

This invention is generally related to control of transistor quiescent current. More particularly, it is related to a system for compensating for changes in a power amplifier's supply voltage such that the power amplifier's quiescent current is stabilized for changing operating conditions.

2. Related Art

The quiescent current drawn by a transistor is generally approximated by a constant when the base-emitter voltage and the collector voltage (Vcc) are constant. When such a transistor is employed in a circuit to perform a task, such as in a power amplifier for a radio frequency (RF) transmitter, maintaining a substantially constant quiescent current over a variety of operating conditions is important.

Prior art methods are available that can maintain substantially stable transmitter base-emitter voltages over a variety of operating conditions. One such example is a mirror bias circuit. A mirror bias circuit employs a reference voltage (Vref) or a reference current (Iref) to maintain a substantially constant base-emitter voltage. However, maintaining a constant collector voltage (Vcc) may be more difficult. When the collector voltage is provided by a battery source, such as in a mobile communication device or portable cell phone, collector voltage changes as the battery is discharged from the initial fully charged state by the use of the device. For example, in one type of mobile communication device, battery voltage may start at a fully charged voltage of 5 volts, and drop to 2.8 volts before the device shuts down because of low battery power conditions.

Prior art techniques have been developed to minimize variations in collector voltage. One technique is to conserve power consumption in the device when not in use. However, such techniques add additional costs, and battery discharge is inevitable. Other methods may employ circuitry that provides a constant collector voltage from the varying battery voltage. However, such circuitry adds cost to the device and may result in extra power consumption.

Thus, a need exists in the industry to address the problem of providing a substantially stable transistor quiescent current over a range of operating conditions (variations in collector voltage) without the use of expensive additional components or sacrifices in power efficiency caused by additional control circuitry.

SUMMARY

The invention provides a system for stabilizing quiescent current in a transistor. Briefly described, one embodiment can be implemented by employing two compensating resistors configured in a mirror bias circuit coupled to a radio frequency (RF) power amplifier circuit such that base-emitter voltages of the transistors are adjusted in a manner such that quiescent current through the RF transistor is stabilized for variations in collector voltage Vcc. In this embodiment, the collector voltage Vcc is associated with the battery power supply in a mobile communication device, such as but not limited to, a cell phone. A first compensating resistor is connected to the base of a mirror transistor, thereby creating a series circuit having the first compensating resistor, a mirror transistor and a reference transistor. A second compensating resistor is connected to the base of a buffer transistor, thereby creating a series circuit having a second compensating resistor, a buffer transistor and the RF transistor.

As collector voltage Vcc decreases, which may occur when the battery power is drained during use of the communication device, less current is drawn through the two above-described series circuits. As the voltage drop across the first compensating resistor decreases, base-emitter voltages of the mirror transistor and the reference transistor tend to increase. These increasing base-emitter voltages are reflected over to the RF power amplifier circuit resulting in an increase in the base-emitter voltages of the buffer transistor and the RF transistor. As the base-emitter voltage of the RF transistor increases, collector current drawn by the RF transistor tends to increase. Thus, the tendency of collector current in the RF transistor, also known as quiescent current, to decrease as the collector voltage Vcc decreases is off-set by a tendency to increase collector current due to the increased base-emitter voltage of the RF transistor.

Alternative embodiments include moving the first compensating resistor to be located between the emitter of the mirror transistor and the base of the reference transistor. Here, the size of the first compensating resistor would be reduced by a factor equal to the amplification of the mirror transistor ($\beta$ mirror transistor). Another embodiment moves the second compensating resistor to be located between the emitter of the buffer transistor and the base of the RF transistor. Likewise, the size of the second compensating resistor is reduced by a factor equal to the amplification of the buffer transistor ($\beta$ buffer transistor). Another embodiment relocates both the first compensating resistor and the second compensating resistor in a manner described above. Other embodiments employ electrical devices that have resistive-like characteristics that provide the required compensation to the transistor base-emitter voltages.

In one embodiment, the size of the first compensating resistor is equal to the size of the second compensating resistor multiplied by the ratio of the buffer transistor current rating to the mirror transistor current rating. In other embodiments, the relative sizing of the compensating resistors may be varied to decrease or increase the amount of compensation applied to the base-emitter voltage of the RF transistor.

Other systems, methods, features, and advantages of the invention will be or become apparent to one with skill in the art upon examination of the following drawings and detailed description. It is intended that all such additional systems, methods, features, and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

1. Current Mirror Circuit Coupled to an RF Power Amplifier Circuit

Figure 1:
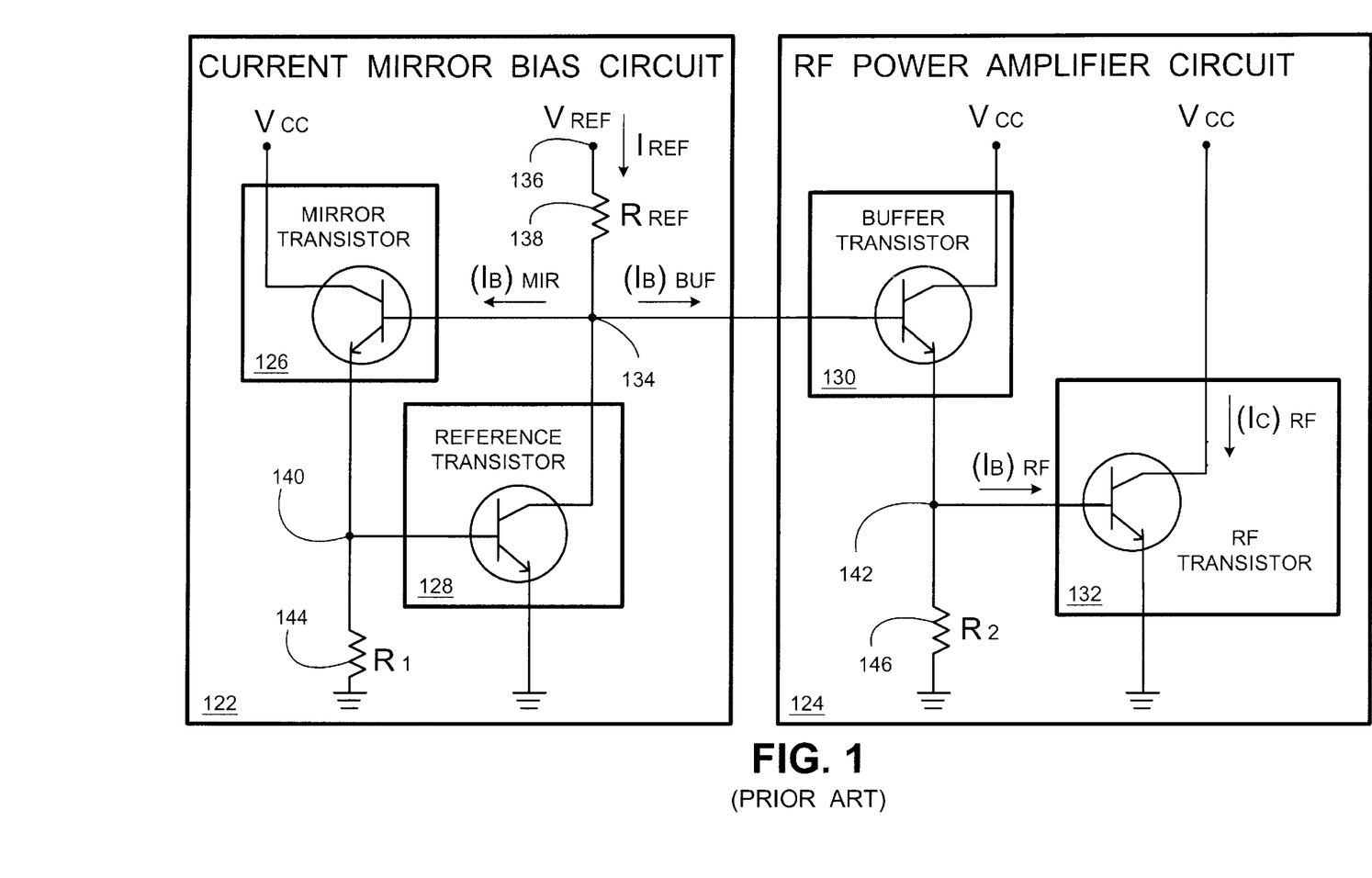
FIG. 1 is a block diagram of a prior art current mirror bias circuit connected to a transistor before the addition of current mirror compensation.

One key factor in controlling quiescent current is the ability to maintain a substantially constant base-emitter voltage over the anticipated range of operating conditions that the device is expected to encounter. FIG. 1. is a block diagram illustrating a current mirror bias circuit 122 coupled to a radio frequency (RF) power amplifier circuit 124.

The mirror bias circuit 122 contains two transistors, a mirror transistor 126 and a reference transistor 128. The RF power amplifier circuit 124 also contains two transistors, a buffer transistor 130 and a radio frequency (RF) transistor 132. Both the mirror transistor 126 and buffer transistor 130 are configured as emitter follower transistors. These two emitter follower transistors are loaded by the bases of the reference transistor 128 and the RF transistor 132, respectively. In each transistor, the base-emitter voltage drop is a relatively constant value of approximately 1.2 to 1.3 volts. With the configuration of the mirror bias circuit 122 and RF power amplifier circuit 124, as shown in FIG. 1, the collectors of mirror transistor 126, the buffer transistor 130 and the RF transistor 132 are connected to the same voltage, Vcc. Here, Vcc designates the transistor's power source, commonly denoted as collector voltage. In some mobile communication devices, Vcc corresponds to the battery supply voltage.

The collector voltage of the reference transistor 128 is the voltage at node 134. Here, because of the design of the mirror bias circuit 122, the voltage at node 134 is substantially constant. Furthermore, the voltage at node 134 is automatically regulated to a predefined value, as described below. As shown in FIG. 1, the voltage at node 134 is determined by the base-emitter voltage drops across the mirror transistor 126 and the reference transistor 128, and by the voltage drop across R ref Node 134 voltage equals the sum of the voltage drop across the mirror transistor 126 and the reference transistor 128, and is typically 2.4 volts to 2.6 volts. Node 134 voltage also equals the reference voltage (Vref) at node 136 minus the voltage drop across the reference resistor 138 (Rref). Given the particular device in which the mirror bias circuit 122 is installed, the design engineer would apply a stable reference voltage (Vref), or a stable reference current (Iref), to node 136 and determine the value of the reference resistor 138 such that the desired stabilizing effect of the mirror bias circuit 122 is achieved.

One skilled in the art will appreciate that once operation of the mirror bias circuit 122 is established, the series circuit of reference resistor 138, mirror transistor 126 and reference transistor 128 will have stable voltage drops across each of the circuit elements. Equation 1 below describes the characteristic voltages of the series circuit described above:

$$Vref=[(Iref) \times (Rref)]+(Vb/e)\text{mirror}+(Vb/e)\text{ref} \quad 1)$$

In Equation 1 above, "(Vb/e) mirror" is the base-emitter voltage of the mirror transistor 126, "(Vb/e) ref" is the base emitter voltage of the reference transistor 128, "(Iref)" is the current through reference resistor 138 and "(Rref)" is the resistance of the reference resistor 138. Also of note is that the voltage at node 134 is the applied base voltage of the mirror transistor 126 because of the direct connection from node 134 to the base of the mirror transistor 126.

During device operation, system operating conditions may vary such that the equilibrium of the voltages of the mirror bias circuit 122 are disturbed. For example, changing temperature conditions of the transistors 126 and/or 128 may cause a slight variance in voltage drops across the various transistor connection points. More significantly, collector voltage may vary as the battery is discharged through device use. One skilled in the art will readily appreciate that as these system operating conditions begin to cause variations in the voltage at node 134, the mirror bias circuit 122 automatically regulates the voltage at node 134 back to the desired operating point because of the close-loop feedback circuit between the mirror transistor 126 and the reference transistor 128.

The Iref current is split into three directions at node 134. The bases of the mirror transistor 126 and the buffer transistor 130 have high direct current (DC) impedances compared to the collector of the reference transistor 128. Therefore, most of the Iref current (i.e. >95%) flows through the reference transistor 128. Because the collector-base junction of the reference transistor 128 and the base-emitter junction of the mirror transistor 126 is configured as a feedback loop, the mirror transistor 126 maintains an operating point such that the reference transistor 128 maintains a substantially constant collector current under varying operating conditions. Thus, change in operating conditions such as temperature and Vcc are compensated for by the feedback loop as shown in FIG. 1.

Also shown in FIG. 1, node 134 is connected to the base of the buffer transistor 130. Since the emitter of the buffer transistor 130 is connected to the base of the RF transistor 132, voltage at node 134 also equals the base-emitter voltage drop of buffer transistor 130 plus the base-emitter voltage drop of RF transistor 132, as seen from Equation 2 below:

$$Vref=[(Iref) \times (Rref)]+(Vb/e)\text{buffer}+(Vb/e)RF \quad 2)$$

Since the base-emitter voltage drop of the four transistors 126, 128, 130 and 132 are all approximately the same, and because the series circuit of the reference resistor 138, buffer transistor 130 and RF transistor 132 is configured similarly to the series circuit of the reference resistor 138, mirror transistor 126 and reference transistor 128, voltages at the various points in the mirror bias circuit 122 are mirrored into the RF power amplifier circuit 124 and are substantially equivalent. For example, the base voltage of the reference transistor 128, as measured at node 140, is substantially the same as the base voltage of the RF transistor 132, as measured at node 142.

2. Transistor Base Current and Base-Emitter Voltage

Figure 2:
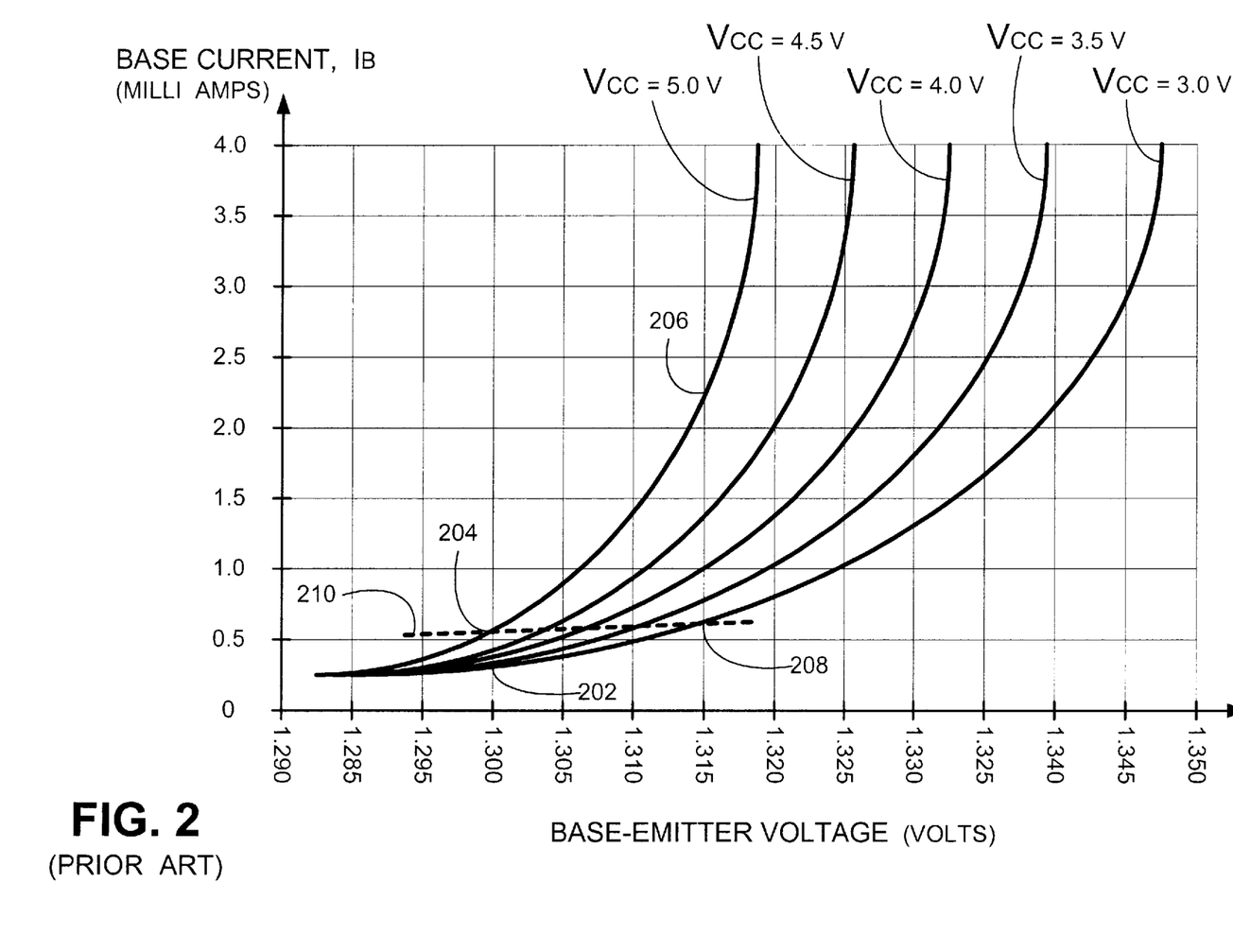
FIG. 2 is a graph of the base-emitter voltage vs. base current characteristics of the transistor shown in FIG. 1.

FIG. 2 illustrates typical base-emitter voltage and base current characteristics of a transistor. For a known base-emitter voltage, the transistor base current can be determined. For example, with the collector voltage Vcc at 3.0 volts and base-emitter voltage at 1.300 volts, the transistor base current is approximately 0.25 milli amps (mA) (see reference number 202).

If the operating conditions of the mirror bias circuit 122 and the RF power amplifier circuit 124 (FIG. 1) are such that the transistors are operating at a base-emitter voltage of 1.300 volts (or less), FIG. 2 illustrates that variations in the collector voltage (Vcc) will not significantly impact the base current of the transistor. Here, FIG. 2 illustrates that a change in Vcc to 5.0 volts only results in an increase in base current to approximately 0.6 mA (see reference numeral 204). Thus, when base-emitter voltage is equal to 1.300 volts, the base current through the transistor only changes from 0.25 mA to 0.60 mA when Vcc changes from 3.0 volts to 5.0 volts. However, if the base-emitter voltages of the transistors are slightly higher, the change in the base current through the transistor may vary dramatically as Vcc changes. For example, with Vcc at 5.0 volts and base-emitter voltage at 1.315 volts, the base current is approximately 2.25 mA (see reference numeral 206). As Vcc decreases to 3.0 volts, the base current drops to approximately 0.6 mA (see reference numeral 208). This 1.65 mA change is significantly greater than the 0.35 mA change when the base-emitter voltage was at the slightly lower base-emitter voltage of 1.300 volts.

Variation in collector current may be even more dramatic than the above noted variations in base current for changes in collector voltage Vcc. As is well known in the art, collector current is equal to the base current times an amplification constant beta ($\beta$). For example, with a base-emitter voltage of 1.315 volts and a $\beta=10$, collector current varies from 22.5 mA when Vcc equals 5.0 volts down to 6 mA as Vcc decreases to 3.0 volts. This 16.5 mA change in collector current may adversely impact the operation of any device having a transistor with the characteristics and operating conditions described above.

In FIG. 1, the collector of the RF transistor 132 is connected to Vcc. The collector current (Ic) of the RF transistor 132, also known as the quiescent current, may vary significantly for changes in Vcc. Although the mirror circuit 122 tends to hold base-emitter voltages of transistors 126, 128, 130 and 132 constant for a variety of operating conditions, controlling base-emitter voltages alone is not sufficient to maintain a substantially constant collector current (quiescent current) through the RF transistor 132.

The stable operation of the mirror bias circuit 122 and the RF power circuit 124 depends on all nodal voltages being the same between the mirror bias circuit and the RF power amplifier circuit, as described above. Collector voltage of the reference transistor 128 is held substantially constant due to the voltage drop of the base-emitter junction (Vbe) of the mirror transistor 126 and the reference transistor 128, which are substantially equal. That is, the total voltage drop from node 134 to ground is approximately equal to two times Vbe (2×Vbe). This 2×Vbe voltage drop is substantially constant and independent of Vcc. However, the collector voltage of the RF transistor 132 is directly dependent on Vcc. Therefore, when Vcc changes, the collector current Ic, or quiescent current, drawn by RF transistor 132 changes.

3. Current Mirror Compensation System Overview

Figure 3:
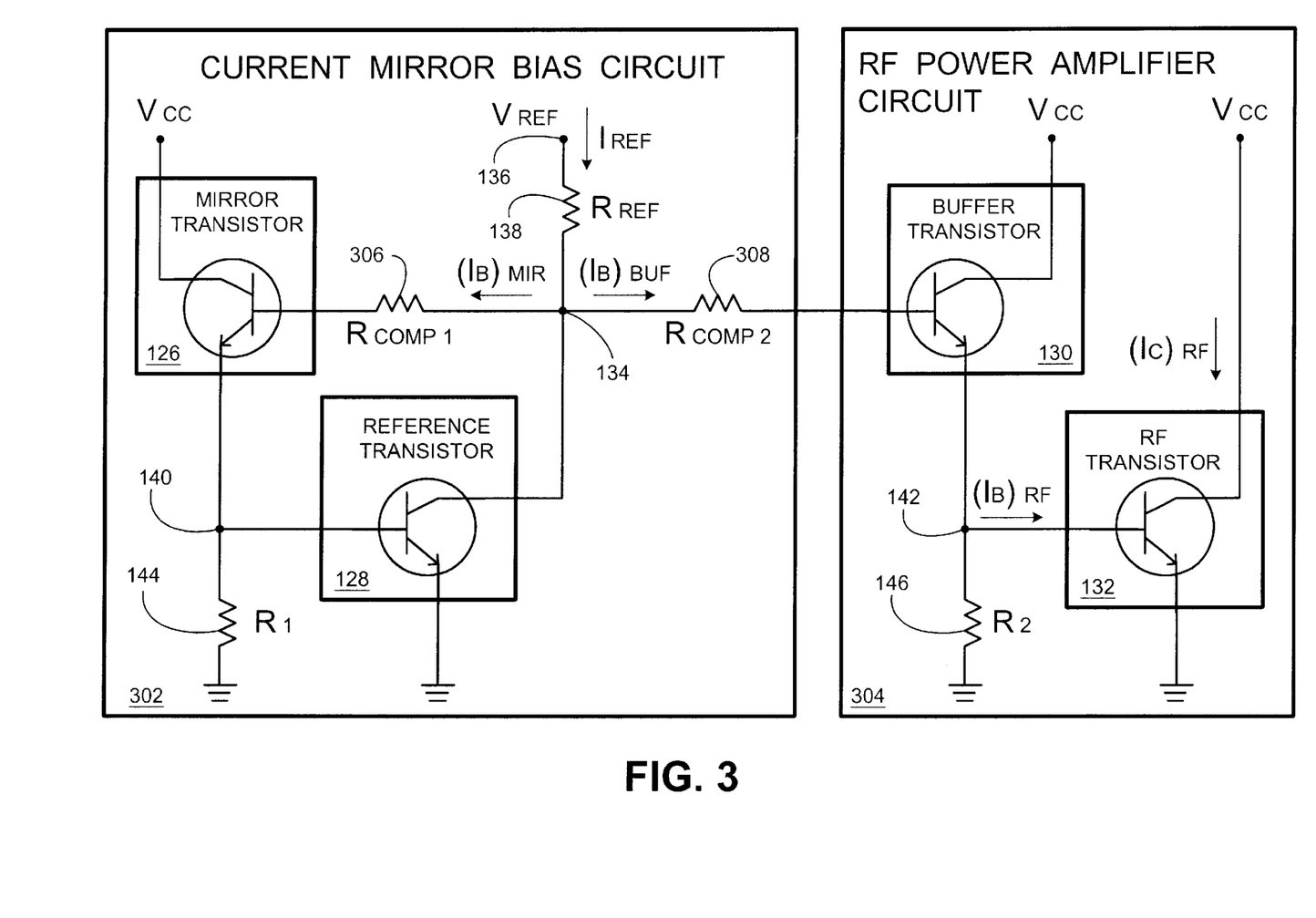
FIG. 3 is a is a block diagram of a current mirror bias circuit employing current mirror compensation connected to the power amplifier of FIG. 1.

FIG. 3 is a is a block diagram of a current mirror bias circuit employing current mirror compensation. The insertion of two compensating resistors, $R_{comp1}$ (see reference numeral 306) and $R_{comp2}$ (see reference numeral 308), into the mirror bias circuit 302 is shown. Mirror bias circuit 302 is coupled to the RF power amplifier circuit 304. For convenience of illustration, elements in FIG. 3 that are similar to those in FIG. 1 bear the same reference numerals. Such elements having the same reference numerals in FIGS. 1 and 3 may be considered to be like elements, however, since these like numeraled elements are incidental to the operation of the invention that utilizes existing portions of the mirror bias circuit 302 and the RF power amplifier circuit 304, one skilled in the art will realize that elements in FIGS. 1 and 3 need not be identical. Therefore, the operation and functionality of like elements that are like numbered will not be described again in detail other than to the extent necessary to understand the operation and functionality of the invention.

Like the mirror bias circuit 122 (FIG. 1), the mirror bias circuit 302 having the compensating resistors 306 and 308 regulate voltages in the mirror bias circuit 302, and mirror those regulated voltages to the RF power amplifier circuit 304 in a similar manner that the mirror bias circuit 122 regulated voltage and mirrored the regulated voltages into the RF power amplifier circuit 124 (FIG. 1). However, the compensating resistors 306 and 308 tend to force a small change to the base-emitter voltages of transistors 126, 128, 130 and 132 in a manner such that the collector current [($I_c$) RF] of the RF transistor 132 (quiescent current) is maintained at a substantially constant value as the collector voltage Vcc varies. That is, as the battery of the mobile communication device discharges when the mobile communication device is used, the collector voltage Vcc, that corresponds to the battery supply voltage, decreases. The effect of compensating resistors 306 and 308 residing in the mirror bias circuit 302 results in a substantially constant quiescent current through RF transistor 132 as the battery voltage decreases.

4. An Embodiment of a Current Mirror Compensation System

Figure 4:
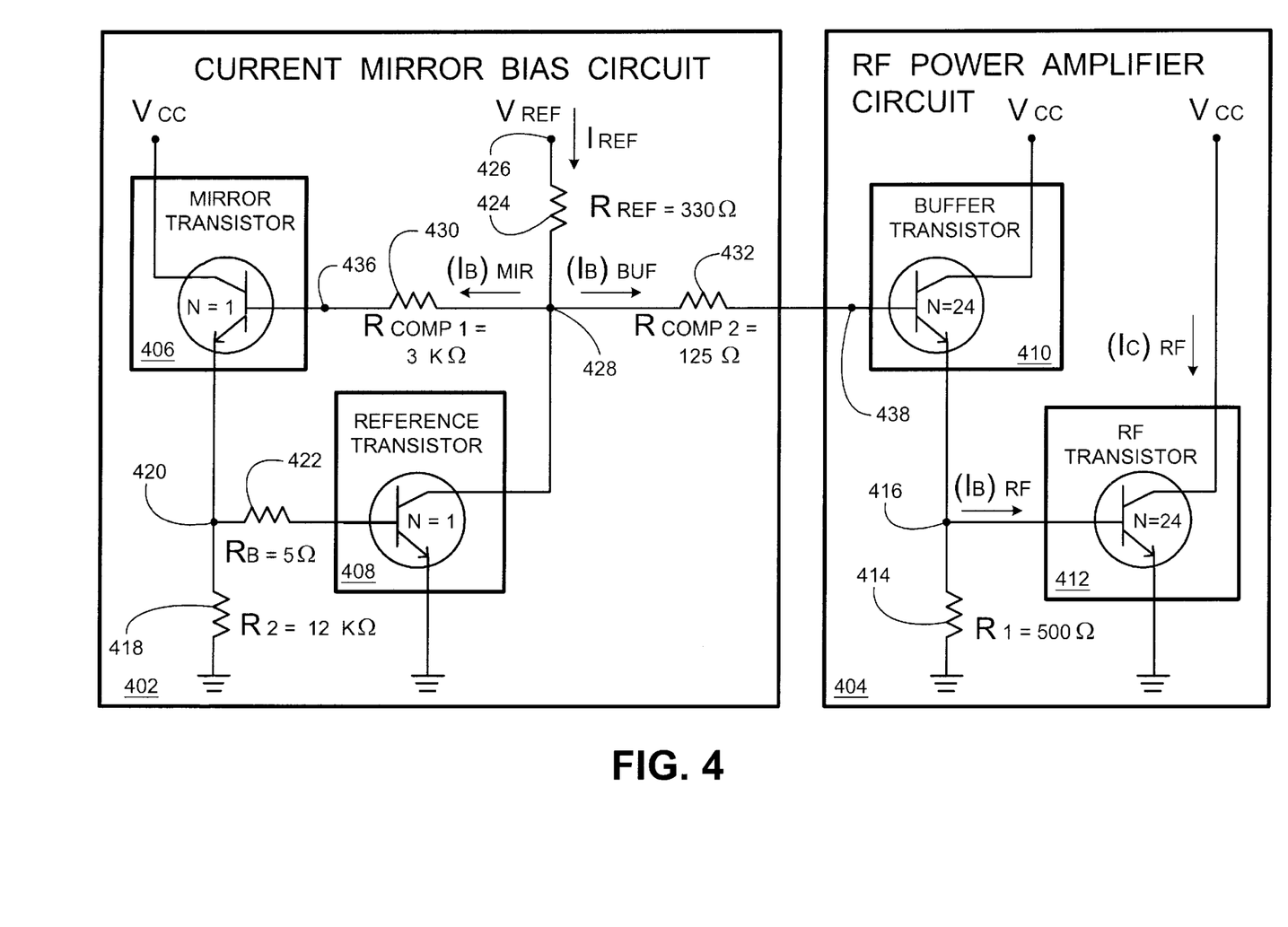
FIG. 4 is a block diagram of an embodiment of a current mirror bias circuit employing compensation of the invention connected to a power amplifier configured according to FIG. 1.

FIG. 4 is a block diagram of an embodiment of a current mirror bias circuit employing compensation of the invention connected to a power amplifier. Mirror bias circuit 402 is coupled to RF power amplifier circuit 404 as shown. A mirror transistor 406 and a reference transistor 408 reside in the mirror bias circuit 402. A buffer transistor 410 and an RF transistor 412 reside in the RF power amplifier circuit 404.

Mirror transistor 406 and reference transistor 408 are the same type of transistor with the same current rating, as indicated by the "N=1" noted on each transistor. Buffer transistor 410 has a transistor current rating of approximately 24 times the size of mirror transistor 406, as indicated by the "N=24" noted on the buffer transistor 410. Also, RF transistor 412 has a current rating of approximately 24 times the current rating of buffer transistor 410, as indicated by the "N=24" noted on the RF transistor 412.

A resistor 414, $R_1$, resides in RF power amplifier circuit 404 and is connected between node 416 and ground. Resistor 414 has a value of 500 ohms ($\Omega$) such that the RF transistor 412 base current [($I_b$) RF] provided by buffer transistor 410 is within the required operating parameters specified for the RF transistor 412 base current. A resistor 418 ($R_2$) resides in the mirror bias circuit 402. Resistor 418 is connected between node 420 and ground as shown in FIG. 4. Resistor 418 has a value of 12 kilo-ohms (k$\Omega$) such that the voltage at node 420 in the mirror bias circuit 402 is reflected into the RF power amplifier circuit 404 at node 416. That is, the voltage at node 420 in the mirror bias circuit 402 equals the voltage at node 416 in the RF power amplifier circuit 404. Since buffer transistor 410 is 24 times the size of the mirror transistor 406, resistor 418 is 24 times the value of resistor 414 [(R₁)×24=R₂].

In this embodiment of the mirror bias circuit 402, a base resistor 422 having a value of 5 Ωs is connected between node 420 and the base of reference transistor 408. Base resistor 422 compensates for real losses that exist in any RF isolation components (not shown) between the bias circuit node 416 and RF transistor 412. The 5 Ω value of the base resistor 422 is sufficiently small so that current flow into the reference transistor 408 is not significantly affected. Also, the voltage drop from node 420 through the base resistor 422 and reference transistor 408 is substantially equal to the base-emitter voltage drop through the reference transistor 408 alone because of the small size of the base resistor 422 and the low base current of reference transistor 408.

A 330 Ω reference resistor 424 ($R_{ref}$) is connected between node 426 and node 428. Reference resistor 424 is sized such that the base current delivered to the mirror transistor 406 [($I_b$) MIR] and the base current delivered to buffer transistor 410 [($I_b$) BUF] are within the specifications for the mirror transistor 406 and the buffer transistor 410.

A first compensating resistor 430 ($R_{comp1}$) is disposed between node 428 and the base of mirror transistor 406 as shown in FIG. 4. A second compensating resistor 432 ($R_{comp2}$) is disposed between node 428 and the base of buffer transistor 410. In this embodiment, the first compensating resistor 430 has a value of 3 kΩs. The second compensating resistor 432 has a value of 125 Ωs. The first compensating resistor 430 is 24 times the size of the second compensating resistor 432 [($R_{comp2}$)×24 =$R_{comp1}$]. While the ratio between the values of the first and second compensating resistors is maintained, different values may be employed in other embodiments to be either higher or lower than the values of the embodiment described above for more or less compensation, respectively.

Equation 3 describes the characteristics of the series circuit residing in the mirror bias circuit 402 consisting of the reference resistor 424, compensating resistor 430, mirror transistor 406 and reference transistor 408. (Because of the small value of the base resistor 422, the voltage drop across base resistor 422 is negligible, and thus, is omitted from equation 3.) Equation 4 describes the characteristics of the series circuit consisting of the reference resistor 424, compensating resistor 432, buffer transistor 410 and RF transistor 412.

$$Vref=[(Iref)\times(Rref)]+[((I_B)\text{mir})\times(R_{comp1})]+(Vb/e)\text{mirror}+(Vb/e)\text{ref} \quad (3)$$

$$Vref=[(Iref)\times(Rref)]+[((I_B)\text{buf})\times(R_{comp2})]+(Vb/e)\text{buffer}+(Vb/e)\text{RF} \quad (4)$$

In Equations 3 and 4 above, given that the base-emitter voltage of the transistors 406, 408, 410 and 412 are approximately equal, and given the 24 times ratio size of compensating resistors 430 and 432, voltages at nodes 436 and 420 of the mirror bias circuit 402 are reflected into the RF power amplifier circuit 404 at nodes 438 and 416, respectively. That is, voltage at node 420 is reflected into node 416 such that the voltage at node 416 is substantially equal to the voltage at node 420. However, the addition of the first compensating resistor 430 and the second compensating resistor 432 provides for a variable voltage at node 428 in a manner described below. This variable voltage at node 428 provides for compensation of the base-emitter voltages of transistors 406, 408, 410 and 412 such that variations in collector voltage Vcc can be compensated for any manner so that the collector current of the RF transistor 412 [($I_c$) RF], also known as the quiescent current of the RF power amplifier circuit 404, is maintained at a substantially constant value.

5. Operation and Functionality of Mirror Circuit Bias Compensation

The effect of the compensating resistors 430 and 432 (FIG. 4) residing in the mirror bias circuit 402 is to slightly reduce base-emitter voltages of transistors 406, 408, 410 and 412 for high collector voltages, and to slightly increase the base-emitter voltages of transistors 406, 408, 410 and 412 for lower collector voltages Vcc. As illustrated in FIG. 2, when the collector voltage Vcc is equal to 3.0 volts, a base current of approximately 0.6 mA can be drawn by the transmitter when the base-emitter voltage is set to 1.315 volts, as indicated by reference numeral 208. The base current drawn by the transistor may be 2.25 mA with a collector voltage Vcc equal to 5.0 volts (206). However, if the base voltage could be reduced to 1.300 volts when the collector voltage Vcc was equal to 5.0 volts, the base current drawn by the transistor would equal approximately 0.6 mA (204). Thus, reducing the emitter voltage from 1.315 volts (when Vcc equals 3.0 volts) to 1.300 volts, when collector voltage Vcc equals 5.0 volts) results in a substantially constant base current being drawn by the transmitter for operating conditions when the collector voltage is equal to 3.0 volts or 5.0 volts, respectively. Furthermore, if the base-emitter voltage could be reduced in a linear manner from 1.315 volts (when Vcc equals 3.0 volts) to 1.300 volts (when Vcc equals 5.0 volts) as Vcc is increasing from 3.0 volts to 5.0 volts, the base current drawn by the transistor would remain substantially constant at approximately 0.6 mA. This approximately constant operating range is shown by the dashed line 210 on FIG. 2.

When all elements in the device are in a stable operating condition, the voltages at the various nodes in the mirror bias circuit 402 are reflected into the RF power amplifier circuit 404. Because of the feedback loop in the mirror bias circuit 402, the voltage at node 428 is held at a substantially constant value during the operation of the device. However, when compared to the mirror bias circuit 122 (FIG. 1), the addition of the compensating resistor 430 changes the series circuit from node 428 through the mirror transistor 406 and the reference transistor 408, as shown by equation 3 above. This series circuit now includes the compensating resistor 430. The voltage drop through this series circuit ($R_{comp1}$, mirror transistor 406 and reference transistor 408) now varies as a function of the base current drawn by the mirror transistor 406. Voltage at node 436 equals the voltage at node 428 minus the voltage drop across the compensating resistor 430 ($R_{comp1}$) Since the base-emitter voltages of the mirror transistor 406 and the reference transistor 408 are substantially equal, the base-emitter voltages of the transistors 406 and 408 equal one-half of the voltage at node 436. (Here, the voltage drop across the base resistor 422 is neglected in this explanation because the base current drawn by reference transistor 408, and the associated voltage drop across the 5Ω base resistor 422, are so small in relation to the voltage drops across the compensating resistor 430 and the base-emitter voltages of transistor 406 and 408.)

As the battery discharges through device use, the collector voltage Vcc decreases. The mirror transistor 406 draws less collector current as Vcc begins to decrease. Mirror transistor 406 then draws a correspondingly decreasing amount of base current. As the base current of mirror transistor 406 decreases, the voltage drop through the first compensating resistor 430 ($R_{comp1}$) decreases. Since the voltage at node 428 is held at a substantially constant value, the base-emitter voltage of the mirror transistor 406 and the reference transistor 408 each increase by approximately one-half of the amount of the voltage decrease seen by the first compensating resistor 430. By proper selection of the value of the compensating resistors 430 and 432 (3 kΩs and 125 Ωs, respectively), base-emitter voltages across transistors 406, 408, 410 and 412 can be compensated according to the dashed line 210 shown in FIG. 2.

In summary, since the second compensating resistor 432 ($R_{comp2}$) is 24 times smaller than the first compensating resistor 430 ($R_{comp1}$), the voltage at node 436 in the mirror bias circuit 402 are reflected into the RF power amplifier circuit 404 such that the voltage at node 438 substantially equals the voltage at node 436. Similarly, the voltage at node 420 in the mirror bias circuit 402 is reflected into the RF power amplifier circuit 404 at node 416. Thus, the base-emitter voltages of the buffer transistor 410 and the RF transistor 412 are forced to change in the same manner as the base-emitter voltages of mirror transistor 406 and reference transistor 408 for changes in collector voltage Vcc.

Figure 5:
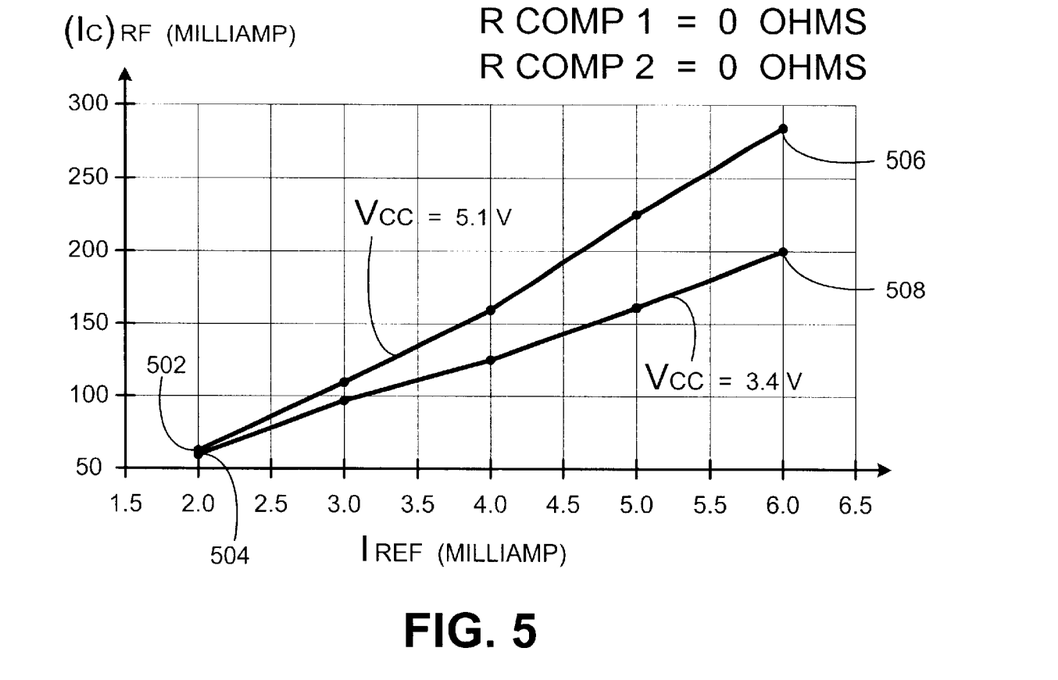
FIG. 5 is a graph of the collector current (Ic) in the RF transistor of FIG. 1 as a function of reference current (Iref) for two collector voltages when no current mirror compensation is employed (R comp=0 Ωs).
Figure 6:
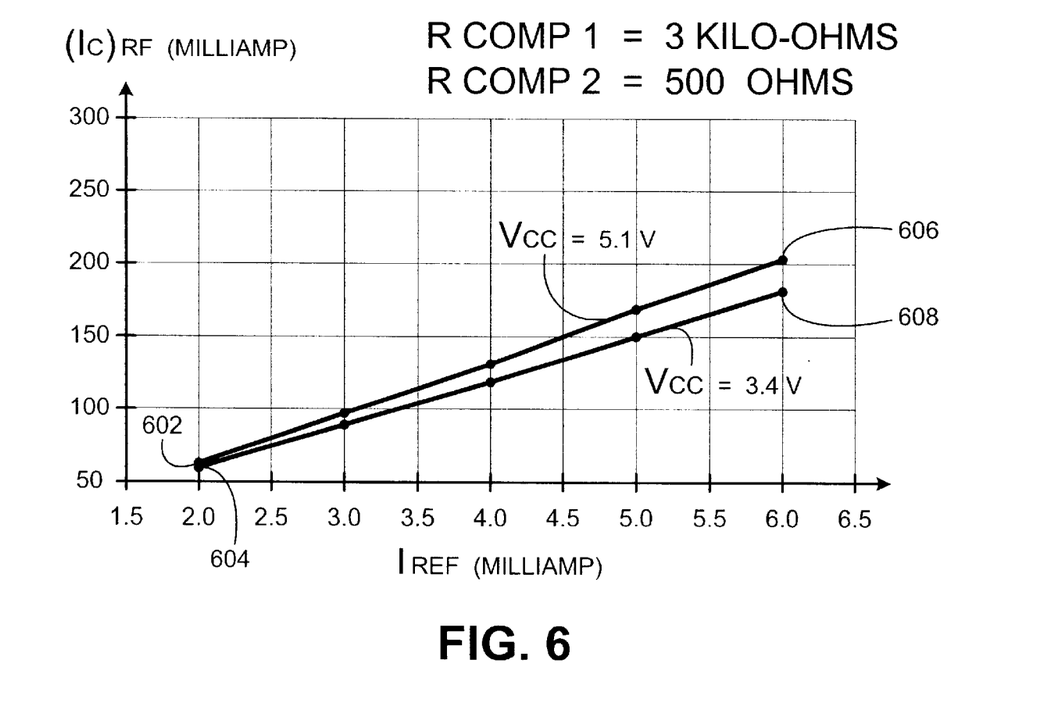
FIG. 6 is a graph of the collector current (Ic) in the RF transistor of FIG. 1 as a function of reference current (Iref) for the two collector voltages shown in FIG. 4 when current mirror compensation is employed.

6. Quiescent Current in an RF Power Amplifier Circuit Employing Mirror Bias Circuit Compensation FIG. 5 is a graph of the collector current (Ic) in the RF transistor of FIG. 1 as a function of reference current (Iref) for two collector voltages when no current mirror compensation is employed (R comp=0 Ωs). FIG. 6 is a graph of the collector current (Ic) in the RF transistor of FIG. 1 as a function of reference current (Iref) for the two collector voltages shown in FIG. 4 when current mirror compensation is employed.

FIGS. 5 and 6 illustrate the performance of an embodiment under lab test conditions. FIGS. 5 and 6 graph the relationship between the collector current of the RF transistor 412 (FIG. 4) for various reference currents injected into node 426 (FIG. 4). Each graph contains a plot of collector current versus reference current for collector voltages Vcc of 5.1 volts and 3.4 volts. Here, the collector current of the RF transistor 412 [($I_c$) RF] is also known as the quiescent current of the RF power amplifier circuit 404 (FIG. 4).

FIG. 5 illustrates performance of the RF power amplifier circuit 404 when compensating resistors 430 and 432 (FIG. 4) are set to 0 Ohms. That is, there is no compensation employed in the mirror bias circuit 402 (FIG. 4) and as such, the mirror bias circuitry reduces to the prior art mirror bias circuit 122 (FIG. 1). The graph of FIG. 5 illustrates that when the reference current is set to a low value, changes in the collector current of the RF transistor 412 (FIG. 4) does not vary significantly. For example, when the reference current is equal to 2.0 mA, the collector current decreases from 66 mA (see reference numeral 502) when Vcc equals 5.1 volts down to 61 mA (see reference numeral 504) when Vcc is equal to 3.4 volts.

However, if the reference current (I REF) is set to 6.0 mA, collector current decreases from 286 mA (see reference numeral 506) when Vcc equals 5.1 volts down to 816 mA when Vcc equals 3.4 volts (see reference numeral 508). Thus, the graph of FIG. 5 illustrates that when the reference current (I REF) is at a relatively high value, the collector current of the RF transistor 412 (FIG. 4), also known as quiescent current, can vary dramatically as the collector voltage Vcc varies.

The reference current (I REF) of FIGS. 5 and 6 corresponds to the reference voltage (V REF) of FIGS. 3 and 4 in that either a reference voltage source or a reference current source may be employed in the mirror bias circuits 302 and/or 402 of FIGS. 3 and 4, respectively. Thus, a relatively high reference current (I REF) corresponds to a relatively high reference voltage (V REF) at node 426 of the mirror bias circuit 402 (FIG. 4). The relatively high reference current (I REF) and/or relatively high reference voltage (V REF) corresponds to an operating condition such that the base-emitter voltage of transistors 406, 408, 410 and 412 (FIG. 4) correspond to a relatively high base-emitter voltage as illustrated in FIG. 2.

FIG. 5 also illustrates that when the reference current (I REF) is at a relatively low value, the collector current of the RF transistor 412 (FIG. 4) does not significantly vary when collector voltage Vcc varies. The relatively low reference current (I REF) corresponds to a relatively low reference voltage (V REF) applied to node 426 of the mirror bias circuit 402 (FIG. 4). A relatively low reference current (I REF) and/or relatively low reference voltage (V REF) corresponds to an operating condition where the base-emitter voltages of transistors 406, 408, 410 and 412 (FIG. 4) are operating at a relatively low base-emitter voltage as shown in FIG. 2. As described above, base current, and hence, collector current, does not vary significantly when a transistor is operating with a relatively low base-emitter voltage, as illustrated in FIG. 2.

FIG. 6 illustrates the performance of the RF power amplifier circuit 404 when compensating resistors 430 and 432 are implemented in the mirror bias circuit 402 (FIG. 4). Here, the first compensating resistor 430 ($R_{comp1}$) is set to 3 kΩs. The second compensating resistor 432 ($R_{comp2}$) is set to 500 Ωs. When the reference current is at a relatively low value, the graph of FIG. 6 illustrates that the collector current of the RF transistor 412 [($I_c$) RF], also known as quiescent current, does not significantly vary as the collector voltage Vcc changes. With a reference current (I REF) is equal to 2.0 mA, the collector current decreases from 63 mA (see reference numeral 602) down to 60 mA (see reference numeral 604) as collector voltage Vcc drops from 5.1 volts to 3.4 volts. At relatively low collector currents (I REF), the performance of the RF power amplifier circuit 404 with mirror bias circuit compensation is substantially equivalent to performance without mirror bias circuit compensation.

However, mirror circuit compensation substantially reduces the variation in collector current at relatively high reference currents (I REF). For example, with a reference current (I REF) of 6.0 mA, the collector current drops from 205 mA (see reference numeral 606) to 182 mA (see reference numeral 608) as the collector voltage Vcc drops from 5.1 volts to 3.4 volts. This 23 mA change in collector current of the RF transistor 412 with mirror bias circuit compensation as shown in FIG. 6 is substantially less than the 92 mA change without mirror bias circuit compensation when the reference current (I REF) is equal to 6.0 mA as shown in FIG. 5.

Actual operating conditions in the mirror bias circuit 402 and the RF power amplifier circuit 404, including the selected reference voltage (V REF) and/or selected reference current (I REF) shown in FIG. 4, depend upon other factors that define the required operating parameters for the particular device in which the mirror bias circuit 402 and the RF power amplifier circuit 404 are implemented. Should the particular operating characteristics in which the mirror bias circuit 402 and the RE power amplifier circuit 404 are employed require a relatively high reference voltage (V REF) and/or a relatively high reference current (I REF), the use of compensating resistors 430 and 432 in the mirror bias circuit 402 provide a system that substantially stabilizes the collector current [($I_c$) RF], also known as quiescent current, in the RF transistor 412.

7. Alternative Embodiments

A. Compensation Resistor(s) Located at the Emitter

An alternative embodiment of the mirror bias circuit with compensation employs a relocation of the compensating resistors such that the compensating resistors are coupled to the emitters of the mirror transistor and/or the buffer transistor. Three such alternative embodiments are illustrated in FIGS. 7–9.

Figure 7:
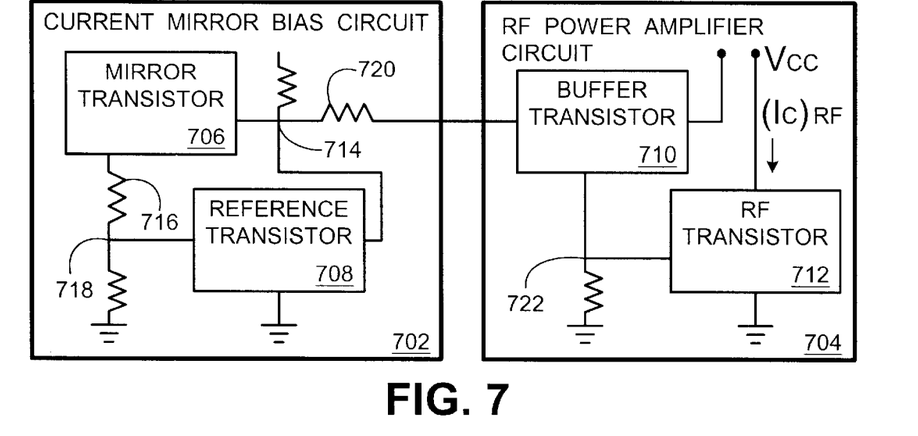
FIG. 7 is a block diagram of an alternative embodiment of a current mirror bias circuit having the first compensating resistor relocated to follow the emitter of the mirror transistor.

FIG. 7 is a simplified illustrative diagram of a mirror bias circuit 702 and an RF power amplifier circuit 704. Mirror transistor 706 and reference transistor 708 reside in mirror bias circuit 702. Buffer transistor 710 and RF transistor 712 reside in RF power amplifier circuit 704. Mirror bias circuit 702 and RF power amplifier circuit 704 are coupled together and configured similarly to the mirror bias circuit 302 and RF power amplifier circuit 304 of FIG. 3. However, the first compensating resistor 306 ($R_{comp1}$) of FIG. 3 has been relocated. The first compensating resistor was originally coupled between node 714 and the base of mirror transistor 706. Now, compensating resistor 716 is coupled between the emitter of the mirror transistor 706 and node 718. Also, the size of the compensating resistor 716 is smaller than compensating resistor 306 (FIG. 3) by a factor of $\beta_{MT}$, where $\beta_{MT}$ is equal to the DC current gain of the mirror transistor 706.

With the configuration of the mirror bias circuit 702 as shown in FIG. 7A, voltage at reference node 718 is reflected into node 720 (such that the voltage at node 720 substantially equals the voltage at node 718), and the effect of the compensating resistors 716 and 720 result in a substantially stable collector current [($I_c$) RF], or quiescent current, through the RF transistor 712. That is, collector current [($I_c$) RF] through RF transistor 712 is stabilized in much the same manner as the collector current of RF transistor 132 (FIG. 3) for changes in collector voltage Vcc.

Figure 8:
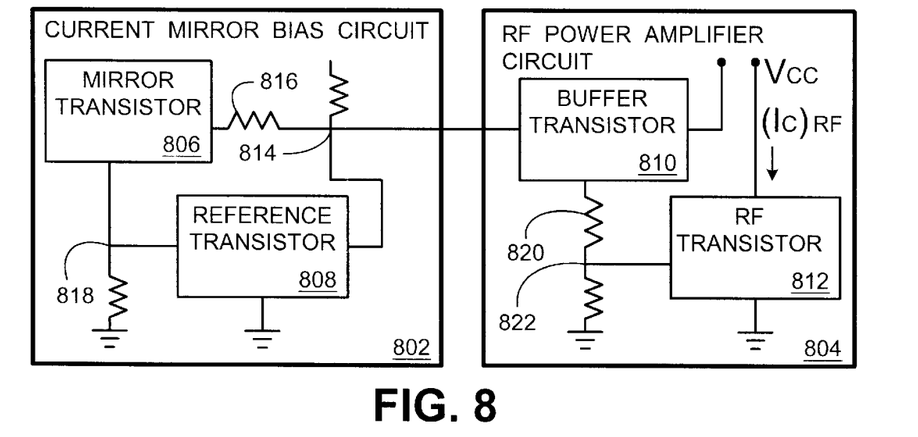
FIG. 8 is a block diagram of an alternative embodiment of a current mirror bias circuit having the second compensating resistor relocated to follow the emitter of the buffer transistor.
Figure 9:
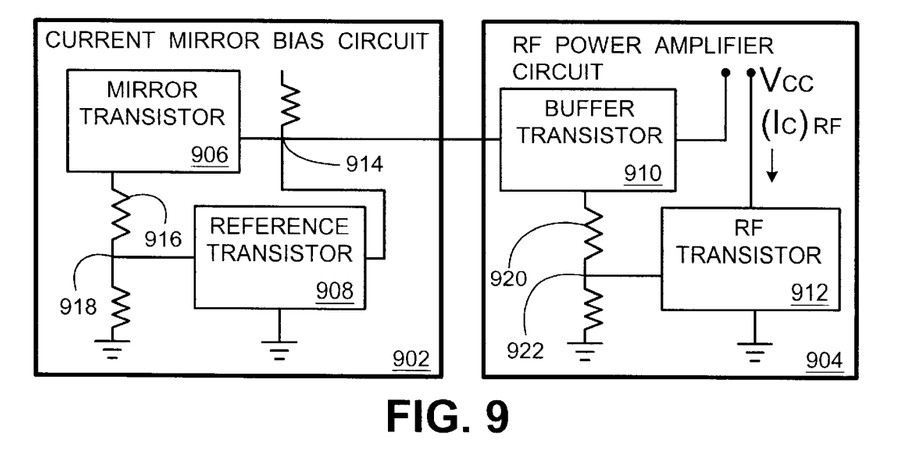
FIG. 9 is a block diagram of an alternative embodiment of a current mirror bias circuit having the first compensating resistor relocated to follow the emitter of the mirror transistor and the second compensating resistor relocated to follow the emitter of the buffer transistor.

FIG. 8 is a simplified illustrative diagram of a mirror bias circuit 802 and an RF power amplifier circuit 804. Mirror transistor 706 and reference transistor 708 reside in mirror bias circuit 802. Buffer transistor 710 and RF transistor 712 reside in RF power amplifier circuit 804. Mirror bias circuit 702 and RF power amplifier circuit 704 are coupled together and configured similarly to the mirror bias circuit 302 and RF power amplifier circuit 304 of FIG. 3. However, the second compensating resistor 308 ($R_{comp2}$) of FIG. 3 has been relocated. The second compensating resistor was originally coupled between node 714 and the base of buffer transistor 710. Now, compensating resistor 806 is coupled between the emitter of the buffer transistor 710 and node 720. Also, the size of the compensating resistor 806 is smaller than compensating resistor 308 (FIG. 3) by a factor of $\beta_{BT}$, where $\beta_{BT}$ is equal to the DC current gain of the buffer transistor 710.

With the configuration of the mirror bias circuit 802 and the RF power amplifier circuit 804 as shown in FIG. 8, voltage at reference node 718 is reflected into node 720 (such that the voltage at node 720 substantially equals the voltage at node 718), and the effect of the compensating resistors 808 and 806 result in a substantially stable collector current [($I_c$) RF], or quiescent current, through the RF transistor 712. That is, collector current [($I_c$) RF] through RF transistor 712 is stabilized in much the same manner as the collector current of RF transistor 132 (FIG. 3) for changes in collector voltage Vcc.

FIG. 9 is a simplified illustrative diagram of a mirror bias circuit 902 and an RF power amplifier circuit 904. Mirror transistor 706 and reference transistor 708 reside in mirror bias circuit 902. Buffer transistor 710 and RF transistor 712 reside in RF power amplifier circuit 904. Mirror bias circuit 902 and RF power amplifier circuit 904 are coupled together and configured similarly to the mirror bias circuit 302 and RF power amplifier circuit 304 of FIG. 3. However, the first compensating resistor 306 ($R_{comp1}$) and the second compensating resistor 308 ($R_{comp2}$) of FIG. 3 have been relocated.

The first compensating resistor was originally coupled between node 714 and the base of mirror transistor 706. Now, compensating resistor 906 is coupled between the emitter of the mirror transistor 706 and node 718. Also, the size of the compensating resistor 906 is smaller than compensating resistor 306 (FIG. 3) by a factor of $\beta_{MT}$, where $\beta_{MT}$ is equal to the DC current gain of the mirror transistor 706.

The second compensating resistor was originally coupled between node 714 and the base of buffer transistor 710. Now, compensating resistor 908 is coupled between the emitter of the buffer transistor 710 and node 720. Also, the size of the compensating resistor 908 is smaller than compensating resistor 308 (FIG. 3) by a factor of $\beta_{BT}$, where $\beta_{BT}$ is equal to the DC current gain of the buffer transistor 710.

With the configuration of the mirror bias circuit 702 as shown in FIG. 9, voltage at reference node 718 is reflected into node 720 (such that the voltage at node 720 substantially equals the voltage at node 718), and the effect of the compensating resistors 906 and 908 result in a substantially stable collector current [($I_c$) RF], or quiescent current, through the RF transistor 712. That is, collector current [($I_c$) RF] through RF transistor 712 is stabilized in much the same manner as the collector current of RF transistor 132 (FIG. 3) for changes in collector voltage Vcc.

B. Resistor-Like Devices

Figure 10:
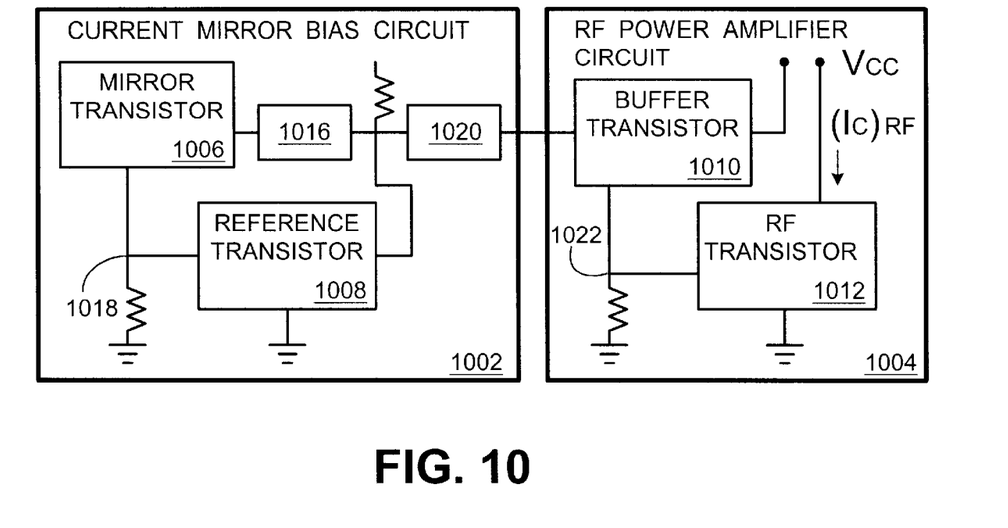
FIG. 10 is a block diagram of an alternative embodiment of the current mirror bias circuit employing devices having resistor-like characteristics.

An alternative embodiment of the mirror bias circuit with compensation may employ impedance elements and/or devices having resistor-like qualities. FIG. 10 illustrates one such alternative embodiment.

FIG. 10 is a simplified illustrative diagram of a mirror bias circuit 802 and RF power amplifier circuit 804. Mirror transistor 806 and reference transistor 808 reside in mirror bias circuit 802. Buffer transistor 810 and RF transistor 812 reside in RF power amplifier circuit 804. Mirror bias circuit 802 and RF power amplifier circuit 804 are coupled together and configured similarly to the mirror bias circuit 302 and RF power amplifier circuit 304 of FIG. 3. However, the compensating resistors 306 and 308 of FIG. 3 are replaced with devices 814 and 816. The parameters of devices 814 and 816 are determined such that the resistive characteristics of devices 814 and 816 are substantially equivalent to the resistance of compensating resistor 306 and 308 (FIG. 3), respectively.

With the configuration of the mirror bias circuit 802 and the RF power amplifier circuit 804, as shown in FIG. 10, voltage at reference node 818 is reflected into node 820 (such that the voltage node 820 equals the voltage at node 818), and the effect of the devices 814 and 816 result in a substantially stable collector current [($I_c$) RF], also known as quiescent current, through the RF transistor 812. That is, collector current [($I_c$) RF] through RF transistor 812 is stabilized in much the same manner as the collector current of RF transistor 32 (FIG. 3) for changes in collector voltage Vcc.

Furthermore, the location of devices 814 and/or 816 may be changed such that devices 814 and/or 816 are following the emitter of mirror transistor 806 and/or buffer transistor 810, respectively. The parameters of devices 814 and/or 816 would be determined in accordance with the system described above.

C. Off-Nominal Compensation Resistor Ratios

An alternative embodiment of the mirror bias circuit with compensation employs compensating resistors that have off-nominal values. In the embodiment of the mirror bias circuit with compensation described with reference to FIG. 4, the ratio of the first compensating resistor 430 to the second compensating resistor 432 was equal to the ration N (the ratio of the buffer transistor 410 to the mirror transistor 406). In the example embodiment illustrated in FIG. 4, this ratio N was equal to 24.

The operation and functioning of a mirror bias circuit with compensation employing an off-nominal ratio is described with reference to FIG. 3. The off-nominal ratio is defined as being equal to the magnitude of first compensating resistor 306 divided by the magnitude of second compensating resistor 308, then divided by the ratio N described above. That is, the off-nominal ratio equals the per unit value of the ratio of the compensating resistors 306 and 308, normalized by the ratio N.

If the off-nominal ratio is greater than 1, the magnitude of compensating resistor 306 divided by the magnitude of compensating resistor 308 is greater than N. When the off-nominal ratio is greater than 1, the base-emitter voltages of buffer transistor 130 and RF transistor 132 will be slightly greater than the base-emitter voltages of the mirror transistor 126 and the reference transistor 128. This occurs because the voltage drop across compensating resistor 308 is less than the voltage drop across compensating resistor 306. This slight difference in base-emitter voltages has the effect of increasing quiescent current through RF transistor 132.

Alternatively, the off-nominal ratio may be less than 1.0. That is, the resistance of compensating resistor 306 divided by the resistance of compensating resistor 308 is less than the ratio N. Here, the mirror transistor 126 and the reference transistor 128 will have slightly higher base-emitter voltages than the buffer transistor 130 and the RF transistor 132. The difference in the base-emitter voltages occurs because the voltage drop across compensating resistor 308 is greater than the voltage drop across compensating resistor 306. This has the effect of decreasing quiescent current through RF transistor 132.

D. Other Alternative Embodiments

While various embodiments of this invention have been described, it will be apparent to those of ordinary skill in the art that many more embodiments and implementations are possible within the scope of this invention.

What is claimed is:

1. A system that stabilizes quiescent current in radio frequency (RF) transistors, comprising:

a mirror transistor having a base and a current rating;

an RF transistor having a base, a quiescent current and a collector, the collector coupled to a power source;

a buffer transistor having a base, an emitter, and a current rating, the emitter of the buffer transistor coupled to the base of the RF transistor;

a first compensating impedance element having a resistance, the first compensating impedance element coupled to the base of the mirror transistor; and a second compensating impedance element having a resistance, the second compensating impedance element coupled to the base of the buffer transistor, such that the resistance of the first compensating impedance element is equal to the resistance of the second compensating impedance element multiplied by a factor, the factor equal to a ratio of the current rating of the buffer transistor to the current rating of the mirror transistor, and such that the quiescent current remains substantially constant after a variation in the power source.

2. The system of claim 1, further comprising:

a reference source;

a reference impedance element coupled to the reference source;

a reference node coupled to the reference source, to the first compensating impedance element and to the second compensation impedance element.

3. The system of claim 2, wherein the reference source is a current source.

4. The system of claim 2, wherein the reference source is a voltage source.

5. The system of claim 1, wherein the first compensating impedance element is a resistor.

6. The system of claim 1, wherein the second compensating impedance element is a resistor.

7. The system of claim 1, wherein the factor is further multiplied by an off-nominal ratio.

8. The system of claim 7, wherein the off-nominal ratio is greater than unity.

9. The system of claim 8, wherein the off-nominal ratio is less than unity.

10. A system that stabilizes quiescent current in radio frequency (RF) transistors, comprising:

a mirror transistor having a base, an emitter, a current rating and a direct current (DC) current gain ($\beta_{MT}$);

a reference transistor having a base;

an RF transistor having a base, a quiescent current and a collector, the collector coupled to a power source;

a buffer transistor having a base, an emitter, and a current rating, the emitter of the buffer transistor coupled to the base of the RF transistor;

a first compensating impedance element having a resistance, the first compensating impedance element coupled to the emitter of the mirror transistor and to the base of the reference transistor; and a second compensating impedance element having a resistance, the second compensating impedance element coupled to the base of the buffer transistor, such that the resistance of the first compensating impedance element is equal to the resistance of the second compensating impedance element multiplied by a factor, the factor equal to a ratio divided by the $\beta_{MT}$, the ratio equal to the current rating of the buffer transistor divided by the current rating of the mirror transistor, and such that the quiescent current is substantially constant after a variation in the power source.

11. A system that stabilizes quiescent current in radio frequency (RF) transistors, comprising:

a mirror transistor having a base and a current rating;

an RF transistor having a base, a quiescent current and a collector, the collector coupled to a power source;

a buffer transistor having an emitter, and a current rating, and a direct current (DC) current gain ($\beta_{BT}$);

a first compensating impedance element having a resistance, the first compensating impedance element coupled to the base of the mirror transistor; and a second compensating impedance element having a resistance, the second compensating impedance element coupled to the emitter of the buffer transistor and to the base of the RF transistor, such that the resistance of the first compensating impedance element is equal to the resistance of the second compensating impedance element multiplied by a factor, the factor equal to a ratio divided by the $\beta_{BT}$, the ratio equal to the current rating of the buffer transistor divided by the current rating of the mirror transistor, and such that the quiescent current is substantially constant after a variation in the power source.

12. A method for stabilizing quiescent current in a transistor, the method comprising the steps of:

providing a reference source to a first compensating impedance element and to a second compensating impedance element;

providing a power source to a collector of a radio frequency (RF) transistor having a base-emitter voltage and a quiescent current;

decreasing voltage across the first compensating impedance element and the second compensating impedance element in response to a decrease in a voltage of the power source; and concurrently increasing the base-emitter voltage of the RF transistor in response to the decrease in the voltage of the power source, such that the quiescent current is substantially constant after the decrease in the voltage of the power source.

13. The method of claim 12, wherein the step of providing the reference source further includes the step of providing a reference voltage source applied to a reference impedance element coupled to the first compensating impedance element and to the second compensating impedance element.

14. The method of claim 12, wherein the step of providing the reference source further includes the step of providing a reference current source through a reference impedance element coupled to the first compensating impedance element and to the second compensating impedance element.

15. The method claim 12, further comprising the step of increasing a base-emitter voltage of a mirror transistor concurrently with the step of increasing the base-emitter voltage of the RF transistor.

16. The method claim 15, further comprising the step of increasing a base-emitter voltage of a reference transistor concurrently with the step of increasing the base-emitter voltage of the RF transistor.

17. The method claim 15, further comprising the step of increasing a base-emitter voltage of a buffer transistor concurrently with the step of increasing the base-emitter voltage of the RF transistor.

18. The method of claim 13, further comprising the steps of:

increasing voltage across the first compensating impedance element and the second compensating impedance element in response to an increase in a voltage of the power source; and concurrently decreasing the base-emitter voltage of the RF transistor in response to the increase in the voltage of the power source, such that the quiescent current is substantially constant after the increase in the voltage of the power source.

19. A system for stabilizing quiescent current in a transistor, comprising:

means for providing a reference source to a first compensating impedance element and to a second compensating impedance element;

means for providing a power source to a collector of a radio frequency (RF) transistor having a base-emitter voltage and a quiescent current;

means for decreasing voltage across the first compensating impedance element and the second compensating impedance element in response to a decrease in a voltage of the power source; and means for concurrently increasing the base-emitter voltage of the RF transistor in response to the decrease in the voltage of the power source, such that the quiescent current is substantially constant after the decrease in the voltage of the power source.

20. The system of claim 19, wherein the means for providing the reference source further includes means for providing a reference voltage source applied to a reference impedance element coupled to the first compensating impedance element and to the second compensating impedance element.

21. The system of claim 19, wherein the means for providing the reference source further includes means for providing a reference current source through a reference impedance element coupled to the first compensating impedance element and to the second compensating impedance element.

22. The system claim 19, further comprising means for increasing a base-emitter voltage of a mirror transistor, the means for increasing the base-emitter voltage of the mirror transistor operating concurrently with the means for increasing the base-emitter voltage of the RF transistor.

23. The system claim 22, further comprising means for increasing a base-emitter voltage of a reference transistor, the means for increasing the base-emitter voltage of the reference transistor operating concurrently with the means for increasing the base-emitter voltage of the RF transistor.

24. The system claim 22, further comprising means for increasing a base-emitter voltage of a buffer transistor, the means for increasing the base-emitter voltage of the buffer transistor operating concurrently with the means for increasing the base-emitter voltage of the RF transistor.

25. The system of claim 19, further comprising:

means for increasing voltage across the first compensating impedance element and the second compensating impedance element in response to an increase in the voltage of the power source; and means for concurrently decreasing the base-emitter voltage of the RF transistor in response to the increase in the voltage of the power source, such that the quiescent current is substantially constant after the increase in the voltage of the power source.

* * * * *

UNITED STATES PATENT AND TRADEMARK OFFICE
CERTIFICATE OF CORRECTION

PATENT NO. : 6,437,647 B1
DATED : August 20, 2002
INVENTOR(S) : Fowler

It is certified that error appears in the above-identified patent and that said Letters Patent is hereby corrected as shown below:

Drawings,
Sheet 6 of 7, consisting of pages 7-9, should be replaced with the corrected drawing sheet 6 of 7, consisting of Figs. 7, as shown on the attached page.
Sheet 6 of 7, FIG. 7, "Current Mirror Bias Circuit", delete the numeral "720", and substitute therefor -- 717 --.
Sheet 6 of 7, FIG. 7, "RF Power Amplifier Circuit", delete the numeral "722", and substitute therefor -- 720 --.
Sheet 6 of 7, FIG. 8, "Current Mirror Bias Circuit", delete the numeral "816", and substitute,, therefor -- 808 --.
Sheet 6 of 7, FIG. 8, "Current Mirror Bias Circuit", delete the numeral "806", and substitute therefor -- 706 --.
Sheet 6 of 7, FIG. 8, "Current Mirror Bias Circuit", delete the numeral "808", and substitute therefor -- 708 --.
Sheet 6 of 7, FIG. 8, "Current Mirror Bias Circuit", delete the numeral "818", and substitute therefor -- 718 --.
Sheet 6 of 7, FIG. 8, "RF Power Amplifier Circuit", delete the numeral "810", and substitute therefor -- 710 --.
Sheet 6 of 7, FIG. 8, "RF Power Amplifier Circuit", delete the numeral "820", and substitute therefor -- 806 --.
Sheet 6 of 7, FIG. 8, "RF Power Amplifier Circuit", delete the numeral "822", and substitute therefor -- 720 --.
Sheet 6 of 7, FIG. 8, "RF Power Amplifier Circuit", delete the numeral "812", and substitute therefor -- 712 --.
Sheet 6 of 7, FIG. 9, "Current Mirror Bias Circuit", delete the number "906", and substitute therefore -- 706 --.
Sheet 6 of 7, FIG. 9, "Current Mirror Bias Circuit", delete the number "914", and substitute therefore -- 714 --.
Sheet 6 of 7, FIG. 9, "Current Mirror Bias Circuit", delete the number "916", and substitute therefore -- 906 --.
Sheet 6 of 7, FIG. 9, "Current Mirror Bias Circuit", delete the number "918", and substitute therefore -- 718 --.
Sheet 6 of 7, FIG. 9, "Current Mirror Bias Circuit", delete the number "908", and substitute therefore -- 708 --.
Sheet 6 of 7, FIG. 9, "RF Power Amplifier Circuit", delete the number "910", and substitute therefore -- 710 --.
Sheet 6 of 7, FIG. 9, "RF Power Amplifier Circuit", delete the number "920", and substitute therefore -- 908 --.
Sheet 6 of 7, FIG. 9, "RF Power Amplifier Circuit", delete the number "922", and substitute therefore -- 720 --.
Sheet 6 of 7, FIG. 9, "RF Power Amplifier Circuit", delete the number "912", and substitute therefore --712--.

UNITED STATES PATENT AND TRADEMARK OFFICE
CERTIFICATE OF CORRECTION

PATENT NO. : 6,437,647 B1
DATED : August 20, 2002
INVENTOR(S) : Fowler

It is certified that error appears in the above-identified patent and that said Letters Patent is hereby corrected as shown below:

Column 11,
Line 32, after the word "and", delete the numeral "720", and substitute therefor -- 717 --.
Lines 42-43, after the word "circuit", delete the numeral "702", and substitute therefor -- 802 --.
Line 43, after the word "circuit", delete the numeral "704", and substitute therefor -- "804" --.

Column 12,
Line 40, after the first occurrence of the word "circuit", delete the numeral "802", and substitute therefor -- 1002 --.
Line 40, after the second occurrence of the word "circuit", delete the numeral "804", and substitute therefore -- 1004 --.
Line 41, after the first occurrence of the word "transistor", delete the numeral "806", and substitute therefor -- 1006 --.
Line 41, after the second occurrence of the word "transistor", delete the numeral "808", and substitute therefor --1008 --.
Line 42, after the word "circuit", delete the numeral "802", and substitute therefor -- 1002 --.
Line 42, after the first occurrence of the word "transistor", delete the numeral "810", and substitute therefor -- 1010 --.
Line 42, after the second occurrence of the word "transistor", delete the numeral "812", and substitute therefor -- 1012 --.
Line 43, after the first occurrence of the word "circuit", delete the numeral "804"; and substitute therefor -- 1004 --.
Lines 43-44, after the second occurrence of the word "circuit", delete the numeral "802", and substitute therefor -- 1002 --.
Line 44, after the word "circuit", delete the numeral "804", and substitute therefor -- 1004 --.
Line 48, after the first occurrence of the word "devices", delete the numeral "814", and substitute therefor -- 1016 --.
Line 48, after the word "and", delete the numeral "816", and substitute therefor -- 1020 --.

UNITED STATES PATENT AND TRADEMARK OFFICE
CERTIFICATE OF CORRECTION

PATENT NO. : 6,437,647 B1
DATED : August 20, 2002
INVENTOR(S) : Fowler

It is certified that error appears in the above-identified patent and that said Letters Patent is hereby corrected as shown below:

<u>Column 12 cont'd,</u>
Line 48, after the second occurrence of the word "devices", delete the numeral "814", and substitute therefor -- 1016 --.
Line 49, after the word "and", delete the numeral "816", and substitute therefor -- 1020 --.
Line 50, after the word "devices", delete the numeral "814", and substitute therefor -- 1016 --.
Line 50, after the word "and", delete the numeral "816", and substitute therefor -- 1020 --.
Line 53, after the word "circuit", delete the numeral "802", and substitute therefor -- 1002 --.
Line 54, after the word "circuit", delete the numeral "804", and substitute therefor -- 1004 --.
Line 55, after the first occurrence of the word "node", delete the numeral "818", and substitute therefor -- 1018 --.
Line 55, after the second occurrence of the word "node", delete the numeral "820", and substitute therefor -- 1022 --.
Line 56, after the first occurrence of the word "node", delete the numeral "820", and substitute therefor -- 1022 --.
Lines 56-57, after the second occurrence of the word "node", delete the numeral "818", and substitute therefor -- 1018 --.
Line 57, after the word "devices", delete the numeral "814", and substitute therefor -- 1016 --.
Line 57, after the second occurrence of the word "and", delete the numeral "816", and substitute therefor -- 1020 --.
Line 59, after the word "transistor", delete the numeral "812", and substitute therefor -- 1012 --.
Line 60, after the word "transistor", delete the numeral "812", and substitute therefor -- 1012 --.
Line 62, after the word "transistor", delete the numeral "32", and substitute therefor -- 132 --.
Line 64, after the word "devices", delete the numeral "814", and substitute therefor -- 1016 --.
Line 64, after the word "and/or", delete the numeral "816", and substitute therefor -- 1020 --.

UNITED STATES PATENT AND TRADEMARK OFFICE
CERTIFICATE OF CORRECTION

PATENT NO. : 6,437,647 B1
DATED : August 20, 2002
INVENTOR(S) : Fowler

It is certified that error appears in the above-identified patent and that said Letters Patent is hereby corrected as shown below:

<u>Column 12 cont'd,</u>
Line 65, after the word "devices", delete the numeral "814", and substitute therefor -- 1016 --.
Line 65, after the word "and/or", delete the numeral "816", and substitute therefor -- 1020 --.
Line 66, after the first occurrence of the word "transistor", delete the numeral "806", and substitute therefor -- 1006 --.
Lines 66-67, after the second occurrence of the word "transistor", delete the numeral "810", and substitute therefor -- 1010 --.
Line 67, after the word "devices", delete the numeral "814", and substitute therefor -- 1016 --.
Line 67, after the word "and/or", delete the numeral "816", and substitute therefor -- 1020 --.

<u>Column 13,</u>
Line 9, after the word "the", delete the word "ration", and substitute therefor -- ratio --.

<u>Column 14,</u>
Lines 11-12, after the word "second", delete the word "compensation", and substitute therefor -- compensating --.

Signed and Sealed this

Twenty-third Day of September, 2003

JAMES E. ROGAN
*Director of the United States Patent and Trademark Office*